(12) United States Patent
Roeden et al.

(10) Patent No.: US 9,411,881 B2
(45) Date of Patent: Aug. 9, 2016

(54) SYSTEM AND METHOD FOR HIGH DYNAMIC RANGE AUDIO DISTRIBUTION

(71) Applicant: Dolby International AB, Amsterdam Zuidoost (NL)

(72) Inventors: Karl Jonas Roeden, Solna (SE); Kristofer Kjoerling, Solna (SE)

(73) Assignee: Dolby International AB, Amsterdam (NL)

( * ) Notice: Subject to any disclaimer, the term of this patent is extended or adjusted under 35 U.S.C. 154(b) by 303 days.

(21) Appl. No.: 14/066,433

(22) Filed: Oct. 29, 2013

(65) Prior Publication Data
US 2014/0135963 A1    May 15, 2014

Related U.S. Application Data

(60) Provisional application No. 61/725,914, filed on Nov. 13, 2012.

(51) Int. Cl.
| | |
|---|---|
| *G06F 17/00* | (2006.01) |
| *G06F 17/30* | (2006.01) |
| *H03G 7/00* | (2006.01) |
| *G10L 19/16* | (2013.01) |

(52) U.S. Cl.
CPC .......... *G06F 17/3074* (2013.01); *G10L 19/167* (2013.01); *G10L 19/173* (2013.01); *H03G 7/007* (2013.01)

(58) Field of Classification Search
CPC ........... H03G 7/007; H03G 3/20; H03G 3/32; H03G 5/165; G10L 19/173
See application file for complete search history.

(56) References Cited

U.S. PATENT DOCUMENTS

| | | | |
|---|---|---|---|
| 7,266,501 B2 | 9/2007 | Saunders | |
| 2005/0078840 A1* | 4/2005 | Riedl | H03G 7/007 381/104 |
| 2009/0226152 A1 | 9/2009 | Hanes | |
| 2011/0009987 A1* | 1/2011 | Seefeldt | H03G 7/007 700/94 |
| 2012/0328115 A1* | 12/2012 | Wolters | H03G 9/00 381/57 |
| 2013/0246077 A1* | 9/2013 | Riedmiller | G10L 19/008 704/500 |

FOREIGN PATENT DOCUMENTS

WO    2011/100155    8/2011

OTHER PUBLICATIONS

Dynamic Range Model Proposal (Forum Discussion, 2011) http://www.gearslutz.com/board/mastering-forum/625227-dynamic-range-model-proposal.html.
Skovenborg, E. et al "Loudness Descriptors to Characterize Programs and Music Tracks" AES presented at the 125th Convention, Oct. 2-5, 2008, San Francisco, CA, USA.

(Continued)

*Primary Examiner* — Curtis Kuntz
*Assistant Examiner* — Thomas Maung

(57) ABSTRACT

A transcoding tool for transcoding an audio stream to be played at a playback device is provided. The transcoding tool comprises a receiving section adapted to receive at least one bit stream comprising an audio stream and metadata associated with the audio stream. The transcoding tool further comprises a processing section connected to the receiving section and adapted to create a processed audio stream based on the audio stream and metadata, and a transmitting section connected to the processing section and adapted to transmit the created processed audio stream to the playback device.

9 Claims, 4 Drawing Sheets

(56) References Cited

OTHER PUBLICATIONS

Lund, Thomas "Control of Loudness in Digital TV" 2006 NAB BEC Proceedings, pp. 57-65.
Katz, Bob "An Integrated Approach to Metering, Monitoring, and Levelling Practices" AES vol. 48, Issue 9, pp. 800-809, Sep. 2000.
Robinson, C. et al "Dynamic Range Control via Metadata" AES Convention 107, Sep. 1999.
Nielsen, S. et al "Level Control in Digital Mastering" AES Convention 107, Sep. 1999.
Cossette, S. et al "New Techniques for Audio Metadata Use and Distribution" AES Convention 107, Sep. 1999.

* cited by examiner

SYSTEM AND METHOD FOR HIGH DYNAMIC RANGE AUDIO DISTRIBUTION

CROSS REFERENCE TO RELATED APPLICATIONS

This application claims the benefit of U.S. Provisional Application No. 61/725,914 filed Nov. 13, 2013, which is hereby incorporated by reference in its entirety.

TECHNICAL FIELD

The present invention relates to a device, system and method for high dynamic range audio distribution.

BACKGROUND

The music production industry typically consists of artists and producers working in a studio to create an audio stream reflecting what the music sounds like when played "live". The human voice and most instruments generates a dynamic sound which varies in loudness as the piece of music varies in frequency, pace and intensity. The studio recording typically reflects this dynamic sound and thus varies in loudness.

The ratio between the loudest portion of an audio stream and the least loud portion is known as the Dynamic Range (DR) of the audio stream. The human ear can potentially hear a very high dynamic range, exceeding 100 dB, but the ability to appreciate the DR is dependent upon the ambient noise. With very little ambient noise, humans can hear and appreciate music with very large variance in loudness.

Music with full DR is preferably heard in a noise free ambient environment, such that the even the least loud portions of the music can be heard and appreciated. However, listening to music in a noise free environment is very unusual to date. An ever increasing amount of music is consumed in portable device in any environment, in car stereos with surrounding noise, or as background music while keeping a conversation.

Listening to music with a very high DR in a noisy environment results some portions of the music not being heard, as these portions are less loud than the noise. Therefore a need exist of adjusting the loudness of the music, such that all portions of the music are heard through the ambient noise, and not only the loud portions.

This adjustment is called mastering and is performed by a Mastering Engineer (ME) who is a person skilled in adapting the audio/music for distribution. As the same audio stream is to be played in high-end stereos and cheep clock-radios, the mastered version is typically a significantly compressed version which looses DR in favor of loudness. The end consumer owning a high-end stereo cannot benefit from the potential as the audio stream with the Dynamic Range Compression (DRC) does not retain the original high DR. Popular music typically has a DR of 6-10 dB, with some forms of music having as little as 1-5 dB.

SUMMARY

A transcoding tool for transcoding an audio stream to be played at a playback device is provided. The transcoding tool comprises a receiving section adapted to receive at least one bit stream comprising an audio stream and metadata associated with the audio stream. The transcoding tool further comprises a processing section connected to the receiving section and adapted to create a processed audio stream based on the audio stream and metadata, and a transmitting section connected to the processing section and adapted to transmit the created processed audio stream to the playback device.

By receiving instructions for the processing of the audio stream in the form of metadata, instead of receiving the processed audio stream, the full dynamic content of the audio stream may be maintained from music production to music consumption, and versions of the audio stream with different processing may be provided by the music producers and selected by the playback device or the end user.

According to one embodiment, the receiving section is further adapted to receive first metadata associated with the audio stream and second metadata associated with the audio stream, and the processing section may further be adapted to select between the first and second metadata, on the basis of a selection criterion. The processing section may then create the processed audio stream based on the audio stream and the selected metadata.

According to one embodiment, the receiving section may further be adapted to receive a user input associated with the selection of metadata, and the processing section may be adapted to use the user input as selection criterion.

The receiving section may be adapted to receive at least one parameter associated with the configuration of the playback device, and the processing section may be adapted to use the at least one parameter as selection criterion. The at least one parameter related to the configuration of the playback device may be received upon transmission by the transmitting section of a request for configuration information to the playback device. In alternative embodiments receiving section may be adapted to receive at least one parameter associated with the ambient environment of the playback device. The at least one parameter related to the ambient environment may be received upon transmission by the transmitting section of a request for ambience information to the playback device.

A method of transcoding an audio stream in a transcoding tool is further provided. The method comprises receiving at least one bit stream comprising an audio stream and metadata associated with the audio stream, creating a processed audio stream based on the audio stream and metadata, and transmitting the created processed audio stream to a playback device.

A playback device for an audio stream is further provided. The playback device comprises a receiving section adapted to receive an audio stream from an audio hoist, and a processing section connected to the receiving section and adapted to create a processed audio stream based on the received audio stream and a processing transfer function.

The playback device may further comprise a memory unit adapted to contain the processing transfer function.

According to one embodiment, the receiving section may further be adapted to receive metadata, and the processing unit may be adapted to derive the processing transfer function based on the received metadata. The metadata may be associated with the audio stream, and the receiving section may receive the metadata file from the audio host.

According to one embodiment, the processing section is adapted to select between a first processing transfer function and a second processing transfer function, on the basis of a selection criterion, and the processing section may further be adapted to create the processed audio stream based on the audio stream and the selected processing transfer function.

According to one embodiment, the receiving section may be adapted to receive first metadata associated with the audio stream and second metadata associated with the audio stream, and the processing section may be adapted to derive the first processing transfer function based on the received first metadata and derive the second processing transfer function based on the received second metadata.

The playback device may further comprise an input device adapted to receive a user input associated with the selection of the processing transfer function to be used, wherein the processing section is adapted to use the user input as selection criterion.

The playback device may further comprise a transmitting section adapted to transmit at least one parameter associated with the configuration of the playback device to the audio host, and the receiving section may further be adapted to receive metadata on the basis of the transmitted parameter.

The playback device may further comprise a transmitting section adapted to transmit at least one parameter associated with the ambient environment of the playback device, and the receiving unit may further be adapted to receive metadata on the basis of the transmitted parameter.

A method in a playback device is further provided, the method comprises receiving an audio stream from an audio host, creating a processed audio stream based on the received audio stream, and a processing transfer function.

An audio host for distributing audio entries and associated metadata is further provided. The audio host comprises a receiving section adapted to receive a request for an audio entry from a playback device, and a transmitting section adapted to transmit the requested audio entry and associated metadata related to the processing of the audio entry to the playback device.

By distributing instructions for the processing of the audio stream in the form of metadata, instead of distributing the processed audio stream, the full dynamic content of the audio stream may be maintained from music production to music consumption, and versions of the audio stream with different processing may be provided by the music producers and selected by the playback device or the end user.

The receiving section of the audio host is adapted to receive playback device information, and the audio host further comprises a processing section adapted select metadata to be transmitted to the playback device, based on the received playback device information.

The receiving section may further be adapted to receive playback device information related to the configuration of the playback device or related to the ambient environment of the playback device.

The transmitting section may be adapted to transmit an information request to the playback device, and the receiving section may be adapted to receive playback device information. The audio host may further comprise a processing section adapted to select metadata to be transmitted to the playback device, based on the received playback device information.

The audio host according to any of the embodiments may further comprise a transcoding tool according to any one of the embodiments herein for creating a processed audio stream based on an audio entry and metadata associated with the audio entry.

A method in an audio host is further provided. The method comprises receiving a request for an audio entry from a playback device and transmitting the requested audio entry and associated metadata related to the processing of the audio entry to the playback device.

A system for audio playback is further provided, the system comprises an audio host and a playback device according to any one of the embodiments herein.

A method for high dynamic range audio distribution is further provided. The method comprises receiving, at a mastering tool, a high dynamic range audio stream, creating, in the mastering tool, at least one processing transfer function to be applied to the high dynamic range audio stream, transferring the high dynamic range audio stream and metadata containing the at least one processing transfer function to a playback device, such that the dynamic range of the audio stream is retained, and creating a processed audio stream at the playback device based on the high dynamic range audio stream and the processing transfer function.

The step of creating at least one processing transfer function associated with the high dynamic range audio stream may comprise crating a plurality of processing transfer functions, and the step of transferring the high dynamic range audio stream and metadata may comprises transferring the high dynamic range audio stream and metadata containing the plurality of processing transfer functions. Furthermore, the step of creating a processed audio stream at the playback device may comprise selecting at least one processing transfer function and create the processed audio stream based on the selected at least one processing transfer function.

A system for high dynamic range audio distribution is further provided. The system comprises a mastering tool adapted to: receive a high dynamic range audio stream, generate at least one processing transfer function associated with the high dynamic range audio stream, and transmitting the high dynamic range audio stream and metadata containing the at least one processing transfer function to a playback device. The system further comprises a playback device adapted to create a processed audio stream based on the high dynamic range audio stream and the processing transfer function, and play the dynamic range processed audio stream.

The mastering tool of the system may further be adapted to generate a plurality of processing transfer functions and transmit the high dynamic range audio stream and metadata containing the plurality of processing transfer functions to a playback device.

The playback device may be adapted to select at least one of the plurality of processing transfer functions and create a processed audio stream based on the high dynamic range audio stream and the selected processing transfer function.

A computer program product comprising a computer readable media with instructions for causing a programmable computer to perform any of the methods herein is further provided.

The metadata in any of the embodiments herein may be related to the dynamic range of the audio stream, the desired loudness profile of the audio stream or to the dynamic range transfer function of the audio stream.

Please note that any embodiment or part of embodiment as well as any method or part of method could be combined in any way.

BRIEF DESCRIPTION OF THE DRAWINGS

Embodiments will now be described with reference to the accompanying drawings, on which.

DETAILED DESCRIPTION

Figure 1:
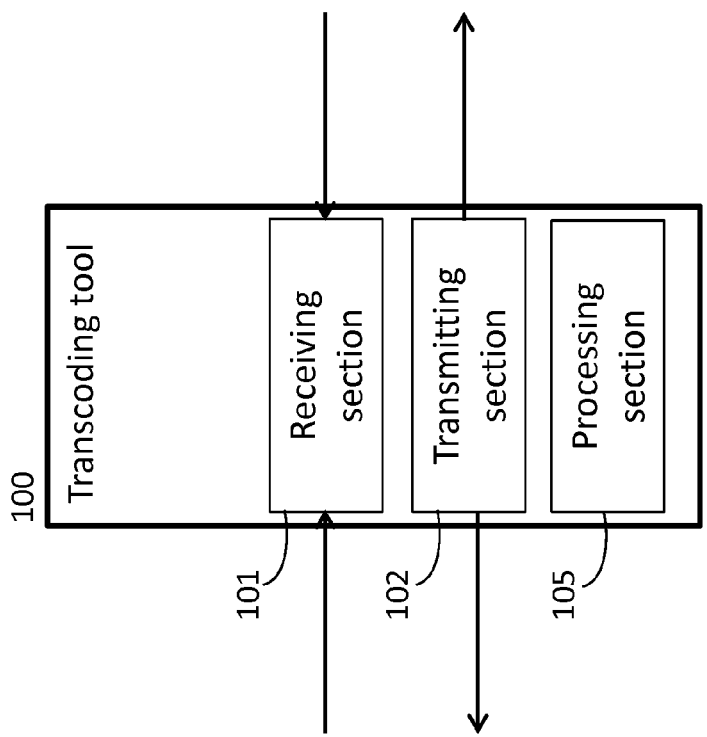
FIG. 1 is generalized block diagram of a transcoding tool.

A transfer function is to be understood as any function adapted to be applied to an audio stream for processing the audio stream and altering the sound of the audio stream when played. The transfer function may for example be applied to perform Dynamic Range Compression (DRC), dynamic range boosting and/or equalization. The transfer function is typically a frequency variable function, enabling frequency-selective processing of the audio. The transfer function may be value-dependent, such that input audio data for a given frequency is mapped to output data in a fashion that may be specified independently for this frequency. In particular the transfer function may specify each frequency a 1-to-1 correspondence between input audio data and output audio data.

High Dynamic Range (HDR) audio is to be understood as audio substantially reflecting audio as recorded or created. Typically, the HDR audio is the studio version of a music recording reflecting the "live" sound of instruments and/or voices.

Metadata is to be understood as any non-audio data containing information, for example related to the processing of an audio stream by means of for example DRC and/or equalization. Metadata could be appended to an audio stream or audio file or could be sent as a separate stream and/or file.

An audio stream is to be understood as any stream of data which could be interpreted and played as audio. An audio stream may be encoded in a lossless format, retaining the dynamic range and content, or in a more compressed format leading to data loss.

An audio entry is to be understood as any stored or partially stored bit stream which could be interpreted and played as audio. An audio entry could be a file, a portion of a file, or a portion of a bit stream streamed through a storage unit.

A processing section is to be understood as any part, unit or portion of a device capable of processing a bit stream. The processing section could be a section of a processing unit or a general purpose computer. The processing section may be a single CPU (Central processing unit), or could comprise two or more processing units. The processing section may include a general purpose microprocessor, an instruction set processor and/or related chips sets and/or special purpose microprocessors such as ASICs (Application Specific Integrated Circuit). The processing section may also comprise board memory for caching purposes.

A receiving and transmitting section is to be understood as any unit or section of a unit capable of receiving and/or transmitting digital content. The receiving and transmitting sections could for example be an I/O interface of the processing section.

Embodiments of a device, system and method for high dynamic range audio distribution are provided herein. The embodiments enable the producers and/or record labels to produce audio content the same way they do it today, but retain the ability to distribute and maintain the high dynamic range version, while allowing the Mastering Engineer (ME) to use existing tools or use new tools specifically designed for adapting a mastered version of an audio stream to a specific playback device or environment. I.e. the ME can for example map the compressors and equalizers (EQs) to a parameterization suitable to go along with the content, and synthesize the content in the way it will be applied on the playback and/or rendering side. Generally speaking, this allows the ME to work in the same manner as today, but without having to "destroy" the original high DR studio content. The ME can thus master the content, in one or multiple versions, and map the different DR and EQ versions to metadata to go along with the original high DR content. The embodiments for example enable the creation of a version for CD, a version for a portable player with earphones e.g. iPod, a version for streaming, a version for high-end stereos etc.

In the following, a detailed description of embodiments of the invention will be given with reference to the accompanying drawings. It will be appreciated that the drawings are for illustration only and are not in any way restricting the scope of the invention.

FIG. 1 shows a generalized block diagram of a transcoding tool 100 for transcoding an audio stream to be played at a playback device, according to one embodiment. The transcoding tool 100 could for example be incorporated in a playback device, such as an iPod® or stereo, or could be incorporated in an audio host, such as a streaming or downloading service, such as iTunes® Spotify®, amazon.com®, Rhapsody®, WIMP or simfy®. The transcoding tool 100 comprises a receiving section 101 adapted to receive at least one bit stream comprising an audio stream and metadata associated with the audio stream.

The audio stream could be an HDR audio stream for example comprising a studio recording of a piece of music. The transcoding tool 100 further comprises a processing section 105 connected to the receiving section 101 and adapted to create a processed audio stream based on the audio data and metadata. The metadata could comprise a processing transfer function generated in a mastering step, adapted to alter the audio stream. The transcoding tool further comprises a transmitting section 102 connected to the processing section 105 and adapted to transmit the created processed audio stream to the playback device, or to the sound generating parts of the playback device in cases where the transcoding tool is incorporated in a playback device.

The receiving section 101 is adapted to receive first metadata and second metadata associated with the audio stream, and the processing section 105 may further be adapted to select between the first and second metadata, on the basis of a selection criterion. The selection criterion could be user input associated with the selection of metadata, received at the receiving section from an input device, or a parameter associated with the configuration of the playback device, which may be stored in a memory unit, or received at the receiving section 101 along with the audio stream. The processing section 105 then creates a processed audio stream based on the received audio stream and the selected metadata.

In some embodiments, the transcoding tool may receive information related to the configuration and/or ambient environment of the playback device automatically along with the audio stream, and in some embodiments, the transcoding tool may have to request the information by transmitting a request for device/ambience information at the transmitting section 102. The receiving section 101 receives the requested parameter and transfers the parameter and/or information derived from the parameter to the playback device for use as selection criterion when selecting the metadata (processing transfer function) to be used.

The metadata in any of the embodiments herein may for example be related to the dynamic range of the audio stream, the desired loudness profile of the audio stream, the dynamic range transfer function of the audio stream or an equalizer to be applied to the audio stream.

Figure 2:
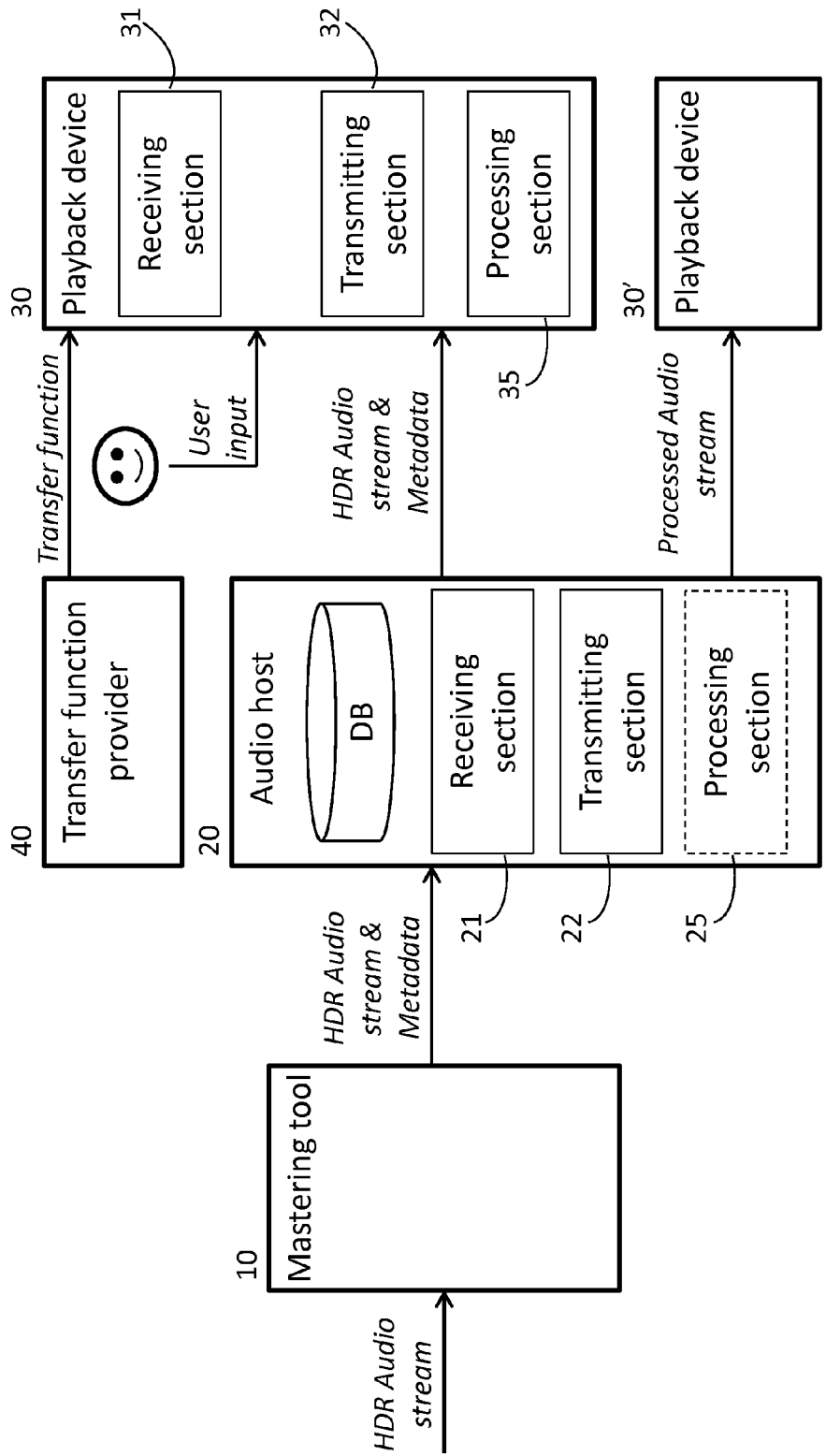
FIG. 2 is an overview of a system for high dynamic range audio distribution in the form of a generalized block diagram.

FIG. 2 shows an overview of an embodiment of a system for HDR audio distribution. The system comprises a mastering tool 10 (encoder) adapted to be used by a Mastering Engineer (ME) for processing a high DR audio stream for altering the DR or adding an equalizer (EQ) to the high DR audio stream. The high DR audio stream is typically a studio recording reflecting the full DR that the instruments and/or human voice generates. The ME typically uses digital tools for compressing the DR of the audio file, thereby creating an audio file with a compressed DR, which on average is louder when played.

By compressing the DR, the audio stream can be played in ambient environments with high noise level and/or in simple play back devices. The work performed by the ME is mainly subjective and artistic and performed by auditioning how the result will sound, i.e. the ME will listen to the processed audio stream in various environments and playback hardware to either create a compromise version that on average produces the best listening experience and/or create specific versions adapted for a specific playback device or a specific ambience. Preferably, the mastering tool includes an interface enabling use if an external DR processing tool, e.g. a software module (plug in) exchanging data with the mastering tool 10.

The version(s) that the ME wishes to distribute further is saved as the HDR audio file in combination with a processing transfer function, which can be applied to the high DR audio stream anywhere in the system to create the processed version of the audio stream that the ME has created. The processing transfer function is coded as metadata to be appended to the high DR audio file, or distributed separately.

The mastering tool 10 could for example be implemented as software in a general purpose computer, or could be a specifically designed compression hardware comprising digital or analog circuitry, or a combination thereof.

The system embodiment shown in FIG. 2 further comprises an audio host 20, which for example could be a music distribution service, such as iTunes® Spotify®, amazon.com®, Rhapsody®, WIMP or simfy®. The audio host 20 is adapted to distribute audio entries, which could be audio files or parts of audio files, and metadata, which may be associated with the audio entries. The audio host 20 receives the HDR audio stream, which may be in the form of an HDR audio file, and the metadata representing the processing transfer function produced by the ME in the mastering tool. The HDR audio stream and the metadata are stored in a file structure in the database DB as an audio entry and associated metadata. The audio entry and the metadata may be stored in a single file, or the metadata may be stored separately, in which case the metadata may additionally comprise a pointer to the associated audio entry.

The audio host 20 comprises a receiving section 21 adapted to receive a request for a specific audio entry from a playback device 30,30' (decoder). The request could come from a playback device 30 capable of applying the metadata containing the processing transfer function, which may be indicated in the request. The request for an audio entry could also come from a playback device 30' which is unable to apply the processing transfer function to the HDR audio stream, in which case the audio host 20 needs to apply the processing transfer function to the HDR audio stream and distribute a processed audio stream to the playback device 30'.

The audio host 20 further comprises a transmitting section 22 adapted to transmit the requested audio entry and associated metadata related to the processing of the audio entry, to the playback device 30,30'.

For the purpose of determining how the audio entry should be processed, either by the audio host 20 or at the playback device 30, the audio host 20 may request playback device information, which may be related to the configuration of the playback device 30,30', and/or environment information, which may be related to the environment in which the playback device is placed, which for example could be related to ambient noise. The receiving section 21 of the audio host 20 is receives the playback device information, and the audio host 20, by means of a processing section 25, selects metadata containing the relevant audio processing transfer function and distributes the relevant information to the playback device 30 based on the received playback device information. The information received from the playback device could also indicate that the playback device 30' is unable to perform the processing step of applying the processing transfer function to the HDR audio entry, in which case the transcoding unit 23 of the audio host applies the transfer function to the HDR audio entry before transmitting the audio entry to the playback device 30'.

The processing section could in any instance be adapted to encode the HDR audio entry to a format possible to decode by the playback device 30, 30'. The format may be a lossless format, such that the decoded audio stream is exactly the same as prior to encoding, or a high density format, such that the DR of the original audio stream is retained through the coding.

Now turning to the playback device 30, that is capable of processing the high DR audio stream by applying the DRC and/or equalizer derived from the metadata received from the audio host 20 (or alternatively received from a transfer function provider 40). The playback device comprises a receiving section 31 adapted to receive the HDR audio stream from the audio host 20. The playback device 30 further comprises a processing section 35 connected to the receiving section 31 and is adapted to create a processed audio stream based on the received audio stream and a processing transfer function. The transfer function may be a transfer function derived from metadata received from the audio host 20, or may be a transfer function stored in a memory unit in the playback device 30, which for example could be a RW, ROM, PROM or RAM memory, and connected to the processing section 35. The system may alternatively comprise a processing transfer function provider 40 which could be independent from the audio host 20, and could supply processing transfer functions for specific audio streams and/or specific playback devices. The playback device 30 may also be capable of accepting user input related to the processing of the HDR audio stream.

The processing section 35 of the playback device 30 is adapted to select between the available processing transfer functions and apply at least one selected transfer function to the received HDR audio stream for creating a processed audio stream suitable for the particular playback device 30 and/or ambient environment in which the playback device 30 is placed. The system provided enables music producers to supply several versions of the music, such that the versions can be adapted to the particular playback device 30 and/or the environment in which the playback device 30 is deployed. The system further enables the end user to choose between different versions of the music depending on for example the ambience and/or personal preference, by providing user input to the playback device 30. The processing unit may in some embodiments combine at least two processing transfer functions to create a third processing function based on the at least two transferring functions. The combining could be performed automatically by the playback device 30, or could be performed based on user input. Combining at least two processing transferring functions could be advantageous when none of the available versions of the music suits the particular ambience or playback device. The combination of the transfer functions may result in an interpolation between two or more reference transfer functions. By including 3 or more reference transfer functions as part of the metadata, it will be possible to interpolate in accordance with a two or higher dimensioned parameter space.

The playback device 30 may further comprise a transmitting section 32 for transmitting at least one parameter associated with the configuration of the playback device 30 to the audio host 20, such that the audio host 20 can transmit metadata on the basis of the received parameter. The parameter may for example be a parameter related to the hardware, such as the playback device being a portable device, the playback device being adapted for ear phone listening, the playback device having a specific loud speaker configuration, the playback device having a specific DAC, the playback device having a specific amplifier, and/or software of the playback device, such as coding formats accepted by the playback device and/or at least one parameter associated with the ambient environment of the playback device, such as ambient noise.

Figure 3:
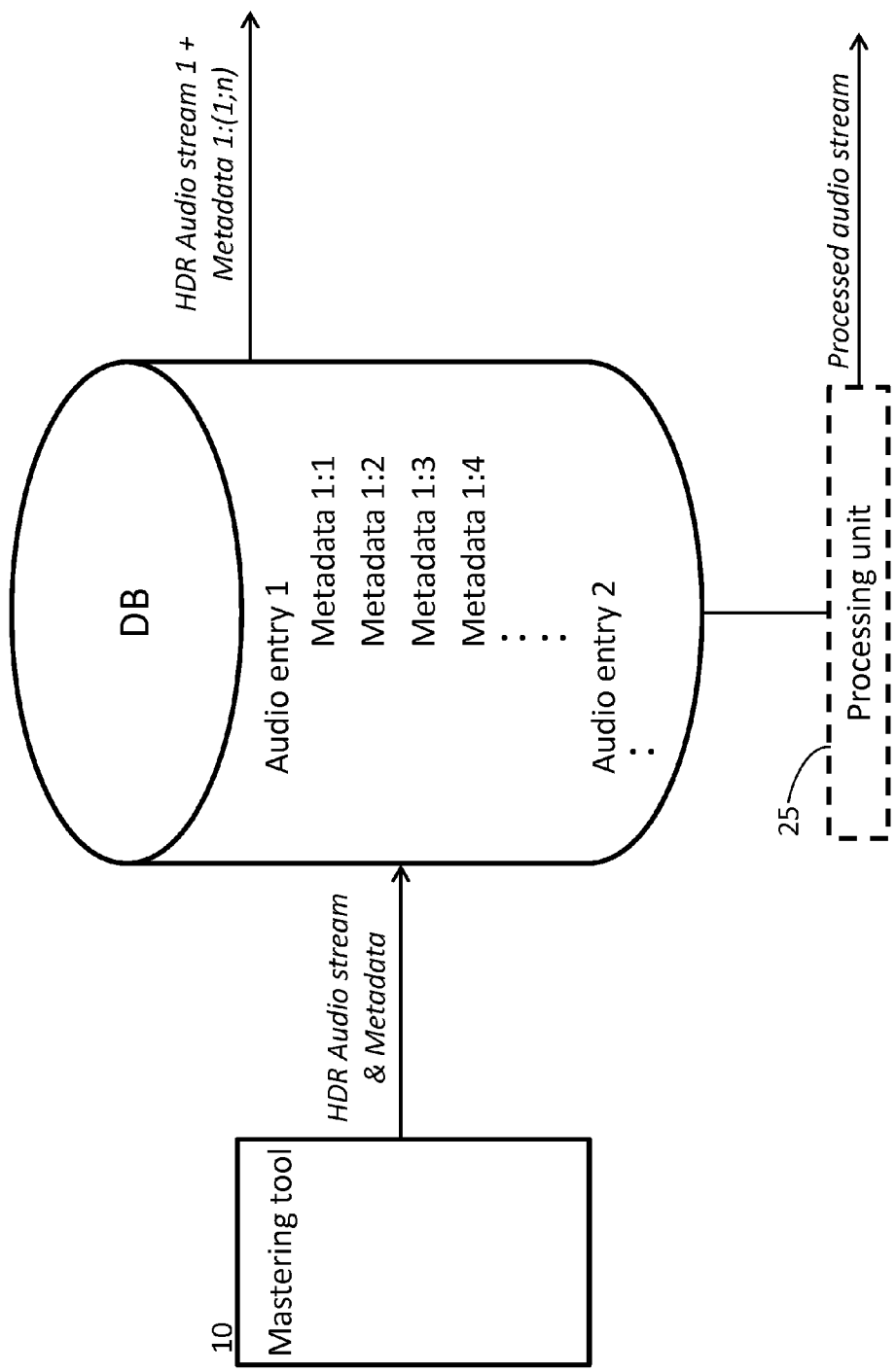
FIG. 3 is an overview of an audio host in the form of a generalized block diagram.

FIG. 3 shows the database DB of the audio host of FIG. 2 in further detail. The database DB comprises audio entries 1, 2 . . . and associated metadata entries 1:1, 1:2 . . . . The plurality of metadata entries contains processing transferring functions related to the respective audio entries 1, 2 . . . , such that each audio entry can have a plurality of processing transfer functions related thereto, enabling a processing unit 25 connected to the database to select which audio entry and associated metadata is to be selected. Alternatively, a playback device connected to the database DB can request a specific audio entry 1, 2 . . . and associated metadata 1:1, 1:2 . . . . The database DB could for example be a relational database which could be implemented on a server, and the data could for example be stored on disk or solid state storage media.

Figure 4:
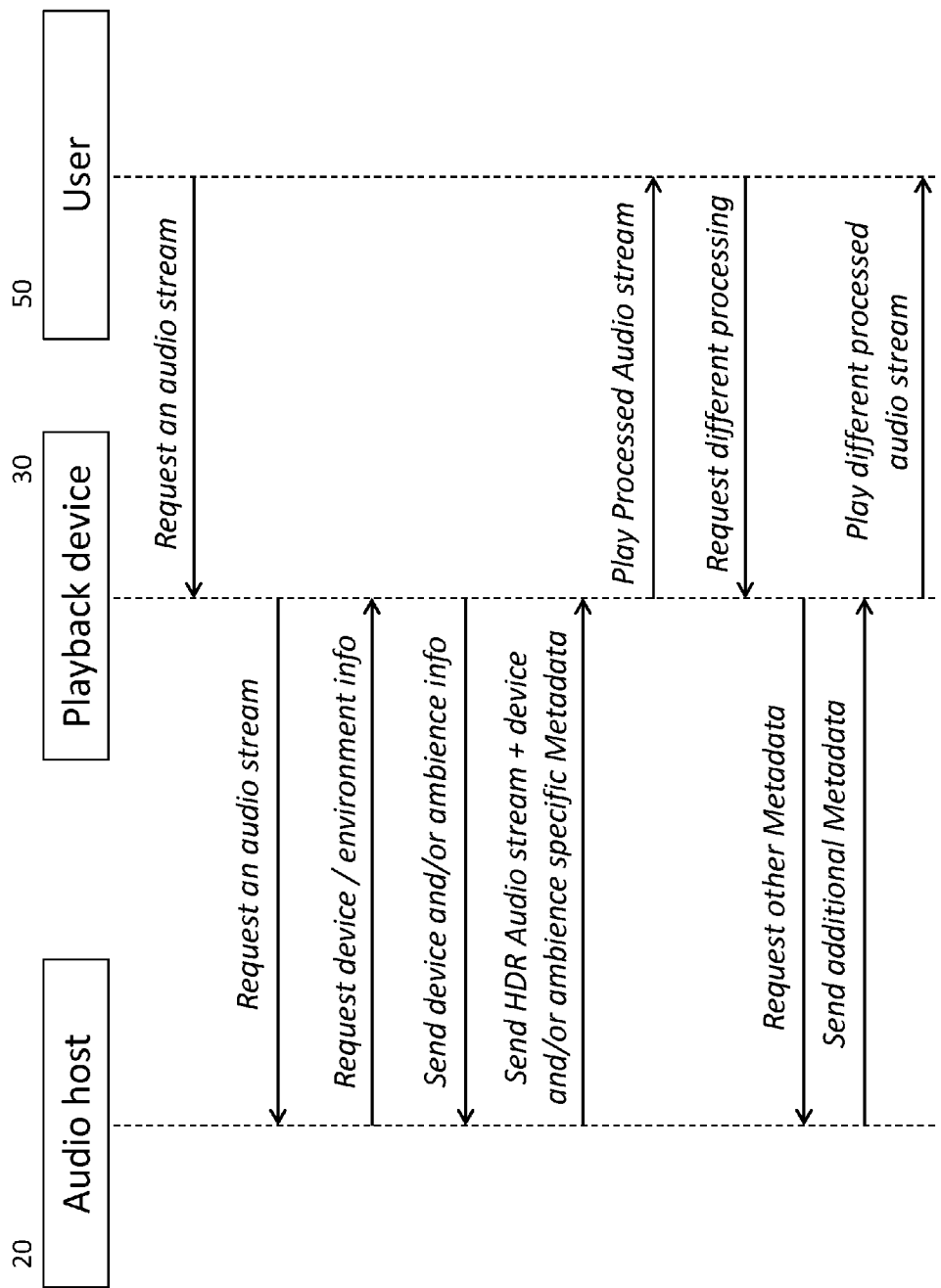
FIG. 4 is a signaling diagram depicting an example of communication between an audio host, a playback device and a user.

FIG. 4 is a signaling diagram showing the communication between the audio host 20 (further described with reference to FIG. 2), the playback device 30 (further described with reference to FIG. 2), and a user 50. In the exemplifying embodiment disclosed in FIG. 4, the user 50 requests a specific audio stream to be played by the playback device 30, which in turn requests the specific audio stream from the audio host 20, (such as from a streaming or downloading service). The audio host 20 requests device and/or environment information from the playback device 30, such that the audio host 20 can select the appropriate coding of the audio stream and processing transfer function to be distributed to the playback device 30. In response to the request, the playback device 30 sends device and/or ambience information to the audio host 20, the device and/or ambience information may alternatively be sent to the audio host 20 in the first step, along with the audio stream request. The audio host 20 then sends the HDR audio stream and the device and/or ambience specific metadata to the playback device 30, which creates a processed audio stream based on the HDR audio stream and the received metadata (containing a processing transfer function).

In cases when the user does not like the received processed audio stream, the user may request a different version (obtained by processing) of the same audio stream. The playback device 30 then requests additional metadata from the audio host 20, which sends the additional metadata to the playback device 30, which sequentially plays the requested different audio stream to the user. In the process described above, the playback device 30 needs to request additional metadata from the audio host 20 to play a different version of the processed audio stream, however, in alternative embodiments it is equally conceivable that the playback device 30 receives all metadata related to a specific audio stream when the audio stream is received for the first time, and then stores the metadata locally, in a memory unit of the playback device 30.

Further embodiments of the present invention will become apparent to a person skilled in the art after studying the description above. Even though the present description and drawings disclose embodiments and examples, the invention is not restricted to these specific examples. Numerous modifications and variations can be made without departing from the scope of the invention, which is defined by the accompanying claims. The systems and methods disclosed hereinabove may be implemented as software, firmware, hardware or a combination thereof. In a hardware implementation, the division of tasks between functional units referred to in the above description does not necessarily correspond to the division into physical units; to the contrary, one physical component may have multiple functionalities, and one task may be carried out by several physical components in cooperation. Certain components or all components may be implemented as software executed by a digital signal processor or microprocessor, or be implemented as hardware or as an application-specific integrated circuit. Such software may be distributed on computer readable media, which may comprise computer storage media (or non-transitory media) and communication media (or transitory media). As is well known to a person skilled in the art, the term computer storage media includes both volatile and nonvolatile, removable and non-removable media implemented in any method or technology for storage of information such as computer readable instructions, data structures, program modules or other data. Please note that any embodiment or part of embodiment as well as any method or part of method could be combined in any way. All examples herein should be seen as part of the general description and therefore possible to combine in any way in general terms.

The invention claimed is:

1. Transcoding tool for transcoding an audio stream to be played at a playback device, the transcoding tool comprising:
a receiving section adapted to receive at least one bit stream comprising an audio stream and first metadata associated with the audio stream and second metadata associated with the audio stream,
a processing section connected to the receiving section and adapted to select between the first and second metadata, on the basis of a selection criterion, wherein the processing section is adapted to use at least one parameter as a selection criterion, said at least one parameter is at least one of:
associated with a configuration of the playback device, and
associated with an ambient environment of the playback device, wherein the receiving section is further adapted to receive said at least one parameter, and
wherein the processing section is further adapted to create a processed audio stream based on the audio stream and the selected metadata, and
wherein the transcoding tool further comprises
a transmitting section connected to the processing section and adapted to transmit the created processed audio stream to the playback device.

2. The transcoding tool according to claim 1, wherein:
the receiving section is further adapted to receive a user input associated with the selection of metadata, and wherein
the processing section is adapted to use the user input as selection criterion.

3. The transcoding tool according to claim 1, wherein the metadata is related to the dynamic range of the audio stream.

4. A playback device for an audio stream, the playback device comprising:
a receiving section adapted to receive an audio stream from an audio host and first metadata associated with the audio stream and second metadata associated with the audio stream, a processing section connected to the receiving section and adapted to derive a first processing transfer function based on the received first metadata and derive a second processing transfer function based on the received second metadata, and wherein the processing section is adapted to select between the first processing transfer function and the second processing transfer function, on the basis of a selection criterion, and wherein the processing section is adapted to use at least one parameter as a selection criterion, said at least one parameter is at least one of:

associated with a configuration of the playback device, and associated with an ambient environment of the playback device, wherein the receiving section is further adapted to receive said at least one parameter, and wherein the processing section is further adapted to create a processed audio stream based on the audio stream and the selected metadata.

5. The playback device according to claim 4, further comprising a memory unit adapted to contain the processing transfer function.

6. The playback device according to claim 4, further comprising an input device adapted to receive a user input associated with the selection of the processing transfer function to be used, and wherein the processing section is adapted to use the user input as selection criterion.

7. The playback device according to claim 4, further comprising a transmitting section adapted to transmit at least one parameter associated with the configuration or ambient environment of the playback device to the audio host, and wherein the receiving section is further adapted to receive metadata on the basis of the transmitted parameter.

8. A method for high dynamic range audio distribution, the method comprising:

receiving, at a mastering tool, a high dynamic range audio stream, creating, in the mastering tool, at least a first and second processing transfer function to be applied to the high dynamic range audio stream, transferring the high dynamic range audio stream and first metadata containing the first processing transfer function and second metadata containing the second processing transfer function to a playback device, such that the dynamic range of the audio stream is retained, selecting, at the playback device, the first or second metadata, based on a selection criterion being at least one of: the configuration of the playback device, and the ambient environment of the playback device, and creating a processed audio stream at the playback device based on the selected at least one processing transfer function and the high dynamic range audio stream.

9. A system for high dynamic range audio distribution, the system comprises:

a mastering tool adapted to:

receive a high dynamic range audio stream, create, at least a first and second processing transfer function to be applied to the high dynamic range audio stream, transfer the high dynamic range audio stream and first metadata containing the first processing transfer function and second metadata containing the second processing transfer function to a playback device, such that the dynamic range of the audio stream is retained, and a playback device adapted to:

select, at the playback device, the first or second metadata, based on a selection criterion being at least one of: the configuration of the playback device, and the ambient environment of the playback device, and create a processed audio stream based on the high dynamic range audio stream and the processing transfer function, and play the dynamic range processed audio stream.

* * * * *